US008847293B2

(12) United States Patent
Lee et al.

(10) Patent No.: US 8,847,293 B2
(45) Date of Patent: Sep. 30, 2014

(54) GATE STRUCTURE FOR SEMICONDUCTOR DEVICE (75) Inventors: Tsung-Lin Lee, Hsinchu (TW); Feng Yuan, Yonghe (TW); Chih Chieh Yeh, Taipei (TW); Wei-Jen Lai, Keelung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 13/411,304

(22) Filed: Mar. 2, 2012

(65) Prior Publication Data

US 2013/0228830 A1  Sep. 5, 2013

(51) Int. Cl.
*H01L 29/772* (2006.01)
*H01L 21/336* (2006.01)

(52) U.S. Cl.
USPC .............. 257/288; 257/E29.255; 257/E21.09; 438/482

(58) Field of Classification Search
CPC ................... H01I 21/823431; H01I 29/41791; H01I 27/0886; H01L 21/823821; H01L 21/485; H01L 27/0924; H01L 27/10826; H01L 27/10829
USPC ............................ 438/151, 154, 482; 257/288
See application file for complete search history.

(56) References Cited

U.S. PATENT DOCUMENTS 5,959,357 A * 9/1999 Korman .................... 257/758
6,174,791 B1 * 1/2001 Lin et al. .................... 438/528
7,400,525 B1 * 7/2008 Kim ............................. 365/156
7,834,399 B2   11/2010 Kanarsky et al.
7,968,915 B2    6/2011 Kanarsky et al.
2002/0132413 A1 * 9/2002 Chang et al. ................ 438/211
2005/0093059 A1 * 5/2005 Belyansky et al. .......... 257/327
2006/0071275 A1 * 4/2006 Brask et al. ................. 257/350
2009/0242944 A1   10/2009 Zhang et al.
2009/0242987 A1 * 10/2009 Van Dal et al. ............. 257/347
2010/0129968 A1 * 5/2010 Li et al. ........................ 438/154
2011/0079855 A1 * 4/2011 Chan et al. ................... 257/368
2011/0089493 A1 * 4/2011 Lander ......................... 257/347
2011/0284967 A1 * 11/2011 Cheng et al. ................. 257/368

OTHER PUBLICATIONS

Tsung-Lin Lee, Feng Yuan, Hung-Li Chiang and Chih Chieh Yeh; "Semiconductor Device Having a Strained Region;" U.S. Appl. No. 13/411,214, filed Mar. 2, 2012; 40 Pages.
Tsung-Lin Lee, Feng Yuan, Hung-Li Chiang and Chih Chieh Yeh; "FinFET Device Having a Strained Region;" U.S. Appl. No. 13/416,926, filed Mar. 9, 2012; 53 Pages.

* cited by examiner

*Primary Examiner* — William F Kraig
*Assistant Examiner* — Pavel Ivanov
(74) *Attorney, Agent, or Firm* — Haynes and Boone, LLP (57) ABSTRACT A semiconductor device and method of fabricating thereof is described that includes a substrate having a fin with a top surface and a first and second lateral sidewall. A hard mask layer may be formed on the top surface of the fin (e.g., providing a dual-gate device). A gate dielectric layer and work function metal layer are formed on the first and second lateral sidewalls of the fin. A silicide layer is formed on the work function metal layer on the first and the second lateral sidewalls of the fin. The silicide layer may be a fully-silicided layer and may provide a stress to the channel region of the device disposed in the fin.

17 Claims, 11 Drawing Sheets

GATE STRUCTURE FOR SEMICONDUCTOR DEVICE

BACKGROUND

The semiconductor integrated circuit (IC) industry has experienced rapid growth. Over the course of this growth, functional density of the devices has generally increased by the device feature size or geometry has decreased. This scaling down process generally provides benefits by increasing production efficiency, lower costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type transistors, also referred to as finFET devices, because the channel is formed on a "fin" that extends from the substrate. FinFET devices may allow for shrinking the gate width of device while providing a gate on the sides and/or top of the fin including the channel region.

Another manner improving the performance of a semiconductor device is to provide stress on or strain to pertinent regions of the device. Manipulating the stress provided in a region is an effective way of improving the minority carrier mobility in a FET device. When stress is applied to a channel of a semiconductor device, the mobilities of the carriers can be affected and as such the transconductance and on-current for the device altered. For example, tensile stress may benefit an NFET device allowing increased mobility of the carriers (e.g., holes) through the channel region. Conversely, compressive stress may benefit a PFET device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, the present disclosure may repeat reference numerals and/or letters in the various examples. This repetition is for the purpose of simplicity and clarity and does not in itself dictate a relationship between the various embodiments. In it is understood that those skilled in the art will be able to devise various equivalents that, although not specifically described herein embody the principles of the present disclosure.

Figure 1:
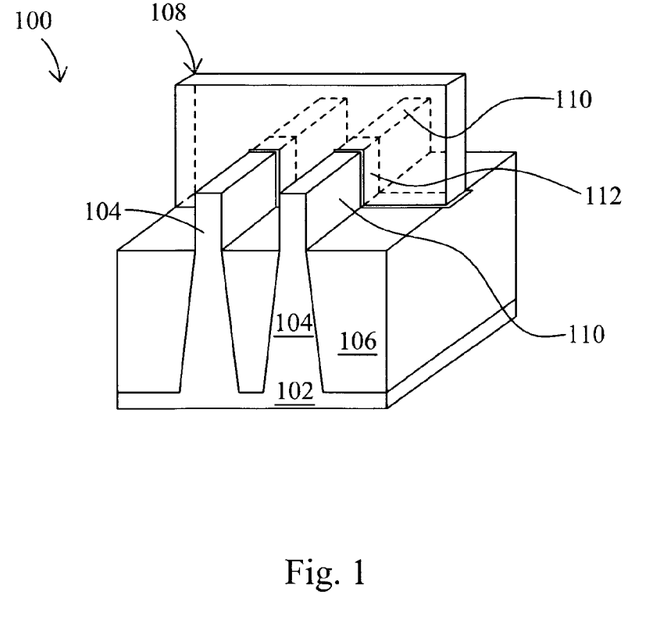
FIG. 1 is a perspective view of an embodiment of a semiconductor device according to one or more aspects of the present disclosure.

Illustrated in FIG. 1 is a semiconductor device 100. The semiconductor device 100 includes finFET type device(s). The semiconductor device 100 may be an n-type finFET or a p-type finFET. The semiconductor device 100 may be included in an IC such as a microprocessor, memory device, and/or other IC. The device 100 includes a substrate 102, a plurality of fins 104, a plurality of isolation structures 106, and a gate structure 108 disposed on each of the fins 104. Each of the plurality of fins 104 include a source/drain region denoted 110 where a source or drain feature is formed in, on, and/or surrounding the fin 104. A channel region of the fin 104 underlies the gate structure 108 and is denoted 112.

The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI) substrate.

The isolation structures 106 may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures are STI features and are formed by etching trenches in the substrate 102. The trenches may then be filled with isolating material, followed by a chemical mechanical polish (CMP). Other fabrication techniques for the isolation structures 106 and/or the fin structure 104 are possible. The isolation structures 106 may include a multi-layer structure, for example, having one or more liner layers.

The fin structures 104 may provide an active region where one or more devices are formed. In an embodiment, a channel of a transistor device is formed in the fin 104. The fin 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into the silicon layer, leaving an extending fin. The recesses may be etched using reactive ion etch (RIE) and/or other suitable processes. Numerous other embodiments of methods to form the fins 104 on the substrate 102 may be suitable.

In an embodiment, the fins 104 are approximately 10 nanometer (nm) wide and between approximately 15 nm and 40 nm high (as measured from height of the fin above the isolation region 106). However, it should be understood that other dimensions may be used for the fins 104. The fins 104 may be doped using n-type and/or p-type dopants.

The gate structure 108 may includes a gate dielectric layer, a work function layer, and/or one or more additional layers. In an embodiment, the gate structure 108 includes a silicide layer such as described in the embodiments below. The silicide layer may overlie the gate dielectric layer and/or the work function layer.

In an embodiment, the semiconductor device 100 is provided during fabrication and the gate structure 108 is a sacrificial gate structure such as formed in a replacement gate process used to form a metal gate structure. In an embodiment, the gate structure 108 includes polysilicon. In another embodiment, the gate structure 108 includes a metal gate structure.

A gate dielectric layer of the gate structure 108 may include silicon dioxide. The silicon oxide may be formed by suitable oxidation and/or deposition methods. Alternatively, the gate dielectric layer of the gate structure 108 may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

In an embodiment, the gate structure 108 may be a metal gate structure. The metal gate structure may include interfacial layer(s), gate dielectric layer(s), work function layer(s), silicide layers as described below, fill metal layer(s), and/or other suitable materials for a metal gate structure. In other embodiments, the metal gate structure 108 may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), CVD, and/or other suitable dielectric.

Exemplary p-type work function metals that may be included in the gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, PVD, and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure. The silicide layer may interpose the work function layer and the fill metal. The silicide layer may be substantially similar to those layers described below, for example, silicide layer 802, silicide layer 902, silicide layer 1402, and/or silicide layer 1702, described below with reference to FIGS. 8, 9, 14, and 17 respectively.

The semiconductor device 100 may include other layers and/or features not specifically illustrated including additional source/drain regions, interlayer dielectric (ILD) layers, contacts, interconnects, and/or other suitable features.

The semiconductor device 100 may benefit in performance from a stress provided on and in the fins 104 in the channel region 112. In an embodiment, a tensile strain may be generated. In another embodiment, a compressive strain may be generated. The strain may be obtained using the method 200, described below with reference to FIG. 2. In an embodiment, the stress is provided to the channel through the placement of a fully silicided layer in the gate structure provided on the channel region. Description of the stress provided by on fin is also described in application Ser. No. 13/243,723, filed on Sep. 23, 2011, which is hereby incorporated by reference in its entirety.

Figure 2:
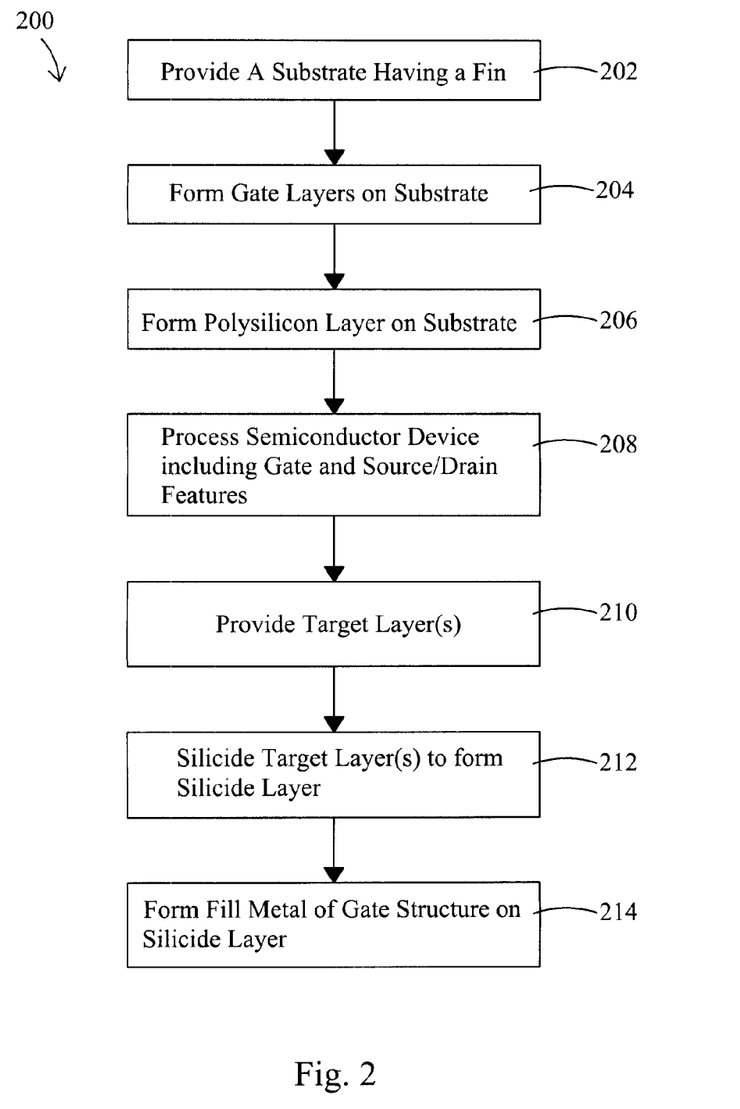
FIG. 2 is a flow chart of an embodiment of a method of fabricating a semiconductor device according to one or more aspects of the present disclosure.

Referring now to FIG. 2, illustrated is flow chart of a method 200 of semiconductor fabrication according to one or more aspects of the present disclosure. The method 200 may be implemented to increase a stress or stain provided in one or more regions of a semiconductor device such as a field effect transistor (FET). In an embodiment, the method 200 may be implemented to form a multi-gate fin-type transistor or finFET device. In an embodiment, the method 200 may be implemented to form a dual-gate finFET device. However, one may recognize other device types that may benefit from the present method. FIGS. 3-19 are cross-sectional views of embodiments of a semiconductor device fabricated according to steps the method 200 of FIG. 2. It should be understood that FIGS. 3-19 and the devices illustrated are representative only and not intended to be limiting.

It should be further understood that the method 200 includes steps having features of a complementary metal-oxide-semiconductor (CMOS) technology process flow and thus, are only described briefly herein. Additional steps may be performed before, after and/or during the method 200. Similarly, one may recognize other portions of a device that may benefit from the methods described herein. It is also understood that parts of the semiconductor device 300 may be fabricated by CMOS technology and thus, some processes are only described briefly herein. Further, the semiconductor device illustrated may include various other devices and features, such as additional transistors, bipolar junction transistors, resistors, capacitors, diodes, fuses, etc., but is simplified for a better understanding of the inventive concepts of the present disclosure. The semiconductor devices described herein may include a plurality of devices interconnected.

The method 200 begins at block 202 where a semiconductor substrate is provided. The semiconductor substrate may be substantially similar to as discussed above with reference to the semiconductor substrate 102 of the semiconductor device 100, described with reference to FIG. 1. In an embodiment, the semiconductor substrate includes a plurality of fins extending from the substrate.

Figure 3:
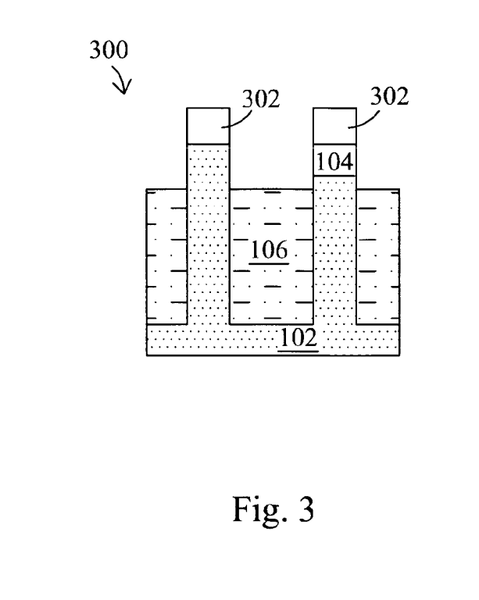
FIGS. 3-5 are cross-sectional views of an embodiment of a semiconductor device according to the process steps of the method of FIG. 2.

Referring to the example of FIG. 3, a semiconductor device 300 includes a substrate 102 having a plurality of fins 104. Isolation structures (e.g., STI features) 106 interpose the fins 104. The semiconductor device 300 may be substantially similar to the semiconductor device 100, described above with reference to FIG. 1.

A hard mask layer 302 overlies the top surface of the fin 104. The hard mask layer 302 may provide for a dual-gate device to be formed on the fin 104 (e.g., the gate structure 108 interfaces the channel region of the fin 104 at the lateral sides of the fin 104, and not the top surface providing a dual-gate (as opposed to a tri-gate) transistor). The hard mask layer 302 may include silicon nitride or other suitable hard mask material.

The method 200 then proceeds to block 204 where gate layers are formed on the substrate. In an embodiment, the gate layers are formed on and/or around a fin extending from the substrate. The gate layers may include a plurality of layers such as interfacial layers, gate dielectric layers, work function layers, capping layers, and/or other suitable layers.

Figure 4:
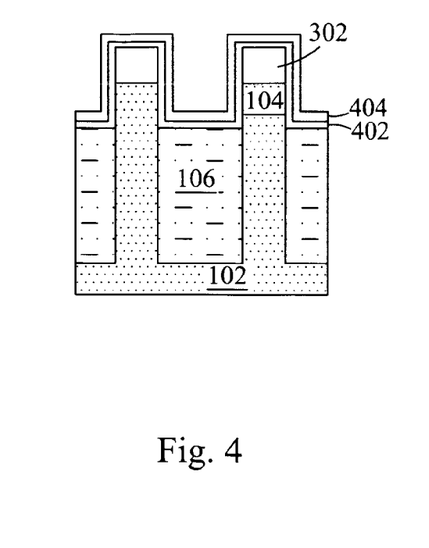
Figure 5:
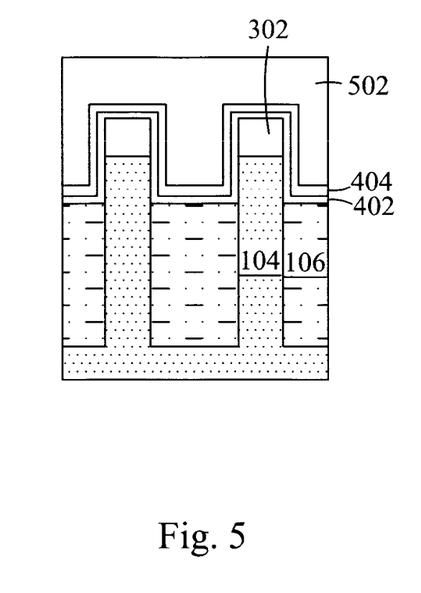

Referring to the example of FIG. 4, a gate dielectric layer 402 and a work function metal layer 404 are disposed on the substrate 102. Specifically, a gate dielectric layer 402 and a work function metal layer 404 are disposed on the fin 104. The gate dielectric layer 402 and the work function metal layer 404 may be subsequently patterned (as discussed below) to be included in gate structure such as the gate structure 108, described above with reference to FIG. 1.

The gate dielectric layer 402 may include silicon dioxide. The silicon oxide may be formed by suitable oxidation and/or deposition methods. Alternatively, the gate dielectric layer 402 may include a high-k dielectric layer such as hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods. An interfacial layer (e.g., silicon oxide) may underlie the gate dielectric layer 402.

The work function metal layer 404 may be an n-type or p-type work function layer. Exemplary p-type work function metals that may be included in the work function metal layer 404 the gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the work function metal layer 404 include Ti, Ag, TaAl, TaAlC, TiAlN, TaC, TaCN, TaSiN, Mn, Zr, other suitable n-type work function materials, or combinations thereof. The work function layer 404 may include a plurality of layers. The work function layer(s) 404 may be deposited by CVD, PVD, and/or other suitable process.

The method 200 then proceeds to block 206 where a polysilicon layer is formed on the substrate. The polysilicon layer may be formed as part of a gate structure overlying the fin. In an embodiment, the polysilicon layer is formed on the gate layers, described above with reference to block 204. The gate layers and the polysilicon layer may be patterned to provide a gate structure such as the gate structure 108, described above with reference to FIG. 1. For example, the polysilicon layer may be a sacrificial layer formed as part of a metal gate formation process (e.g., gate first or gate last replacement gate process). The polysilicon layer may be formed by suitable deposition processes such as, for example, low-pressure chemical vapor deposition (LPCVD) and plasma-enhanced CVD (PECVD). Referring to the example of FIG. 5, a polysilicon layer 502 is formed on the gate layers 402/404.

The method 200 then proceeds to block 208 where additional fabrication processes are performed including patterning the gate structure and forming the source/drain regions of the device.

These fabrication processes may include MOS technology processing to form various features known in the art. For example, the method 200 may include patterning the gate layers and/or polysilicon layer to form a gate structure. The patterning may include photolithography, etching, and/or other suitable processes. A source/drain region(s) may also be formed adjacent the gate structure. In an embodiment, the source/drain region(s) include an epitaxially grown region on and/or around the fin. Spacer elements may be formed abutting the sidewalls of the gate structure. The spacer elements may include one or more layers. In an embodiment, the spacer elements define a source/drain extension region. The source/drain regions may be doped using a junction implant and/or in-situ doped during the epitaxial growth process. A silicide region may be formed on the source/drain region. The silicide materials may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicide contact features can be formed by a process that includes depositing a metal layer, annealing the metal layer such that the metal layer is able to react with silicon to form silicide, and then removing the non-reacted metal layer.

A contact etch stop layer (CESL) and inter-layer dielectric (ILD) may then be formed on the gate structure and/or source/drain regions. Examples of materials that may be used to form CESL include silicon nitride, silicon oxide, silicon oxynitride, and/or other materials known in the art. The CESL may be formed by PECVD process and/or other suitable deposition or oxidation processes. The ILD layer may include dielectric materials such as, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited by a PECVD process or other suitable deposition technique. After its formation, a chemical mechanical polishing (CMP) process may planarize the ILD layer. In an embodiment, the CMP process exposes a top surface of the polysilicon layer, described above in block 206.

The method 200 then proceeds to block 210 where a target layer(s) is prepared on the substrate. The target layer includes silicon. The target layer is a layer which is to be silicided, as described below with reference to block 212. The target layer is formed on the channel region of the device, such that the siliciding of the target layer provides a silicide layer (e.g., fully silicided layer) that can induce channel strain in the device. The target layer may be included in a gate structure, such as, for example, the gate structure 108 described above with reference to FIG. 1.

In an embodiment, the target layer includes the polysilicon layer described above with reference to block 206, or portion thereof. In an embodiment, a layer including silicon is deposited onto the substrate. Various embodiments of forming a target layer are discussed below with reference to FIGS. 6-7, FIGS. 12-13, and FIG. 16 respectively. However, one of ordinary skill in the art would recognize other embodiments within the scope of the present disclosure.

Figure 6:
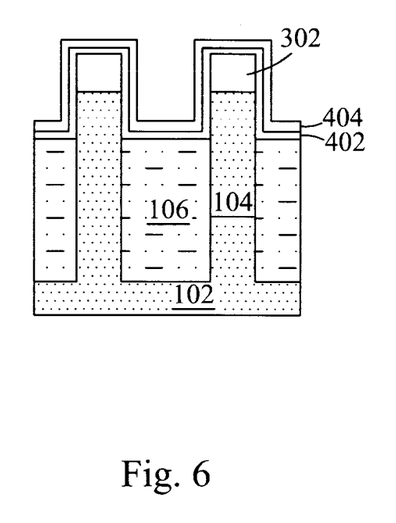
FIGS. 6-11 are cross-sectional views of a first embodiment of the semiconductor device of FIGS. 3-5 at subsequent stages of fabrication according the method of FIG. 2.
Figure 7:
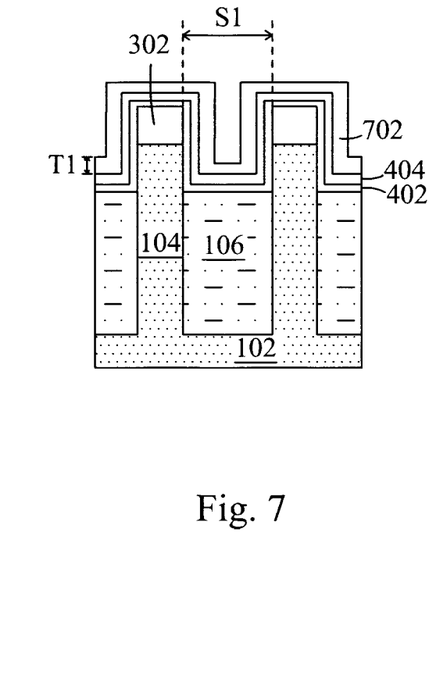

In an embodiment, the target layer is prepared by removing the polysilicon layer, described above with reference to block 206, and forming a layer including silicon on the substrate to provide the target layer. Using FIGS. 6-7 as exemplary, the polysilicon layer 502 is removed from the substrate 102 as illustrated in FIG. 6. The polysilicon layer 502 may be removed by suitable wet or dry etching processes. For example, an etching solution such as, for example, $NH_4OH$, dilute-HF, and/or other suitable etchant may be used. Thereafter, a silicon containing layer 702 is formed on the substrate 102. The layer 702 may be amorphous silicon (a-Si). The layer 702 may be formed by PECVD and/or other suitable processes. The thickness T1 of the layer 702 may be less than approximately half of the space S1 between the fins.

Figure 12:
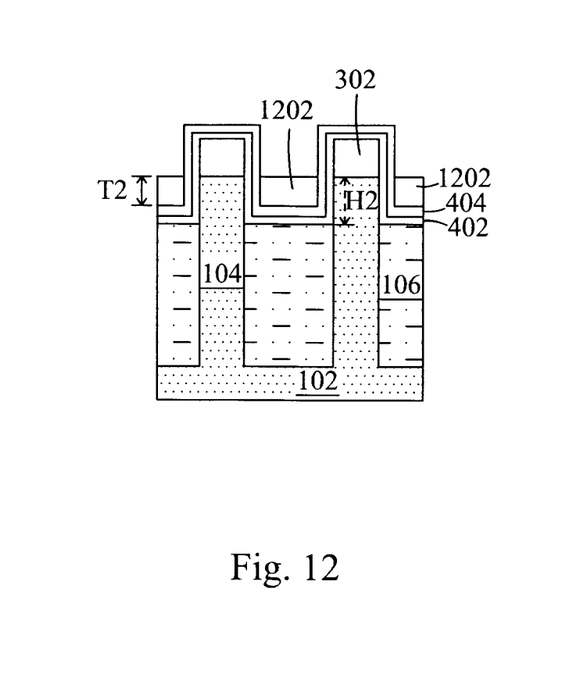
FIGS. 12-15 are cross-sectional views of a second embodiment of the semiconductor device of FIGS. 3-5 at subsequent stages of fabrication according the method of FIG. 2.

In another embodiment, the target layer is prepared by removing a portion of the polysilicon layer, described above with reference to block 206, such that a portion of the polysilicon layer remains on the substrate. An additional layer including silicon may then be formed on the etched polysilicon layer. Using FIGS. 12-13 as exemplary, the polysilicon layer 502 is etched to form the etched polysilicon layer 1202 as illustrated in FIG. 12. The polysilicon layer may be etched by suitable wet or dry etching processes. For example, an etching solution such as, for example, $NH_4OH$, dilute-HF, and/or other suitable etchant may be used. The etched polysilicon layer 1202 has a thickness T2. The thickness T2 may be greater than approximately two-thirds of the height H2, which is the height of the fin 104 above the isolation region 106. Thereafter, a silicon containing layer 1302 is formed on the substrate 102, see FIG. 13. The layer 1302 may be amorphous silicon (a-Si). The thickness T3 of the layer 1302 may be less than approximately half of the space S1 between the fins. In an embodiment, the space S1 is between approximately 2 nm and 10 nm. The silicon containing layer 1302 may be formed directly on the polysilicon layer 1202.

In another embodiment, the target layer is prepared by removing a portion of the polysilicon layer, described above with reference to block 206, such that a portion of the polysilicon layer remains on the substrate. The remaining polysilicon layer is used as the target layer. In an embodiment, no additional silicon containing layer is included in the target layer that is transformed to silicide. Using FIG. 16 as exemplary, the polysilicon layer 502 is etched to form the etched polysilicon layer 1602. The polysilicon layer may be etched by suitable wet or dry etching processes. For example, an etching solution such as, for example, $NH_4OH$, dilute-HF, and/or other suitable etchant may be used. The etched polysilicon layer 1602 has a thickness T3. The thickness T3 may be greater than the height H3, which is the height of the fin 104 above the isolation region 106. In other words, the top surface of the etched polysilicon layer 1602 lies above the top surface of the fin 104.

The method 200 then proceeds to block 212 where the siliciding of the target layer(s), described in block 210, is provided. The target layer(s) described above with reference to block 210 may be fully silicided (e.g., all the silicon consumed to provide silicide). In an embodiment, an amorphous-silicon target layer is transformed to silicide. In another embodiment, an amorphous-silicon layer and an underlying polysilicon layer are transformed to silicide. In an embodiment, a remaining polysilicon layer is transformed to silicide. Each of these embodiments is discussed below with reference to FIGS. 8, 9, FIG. 14, and FIG. 17.

In an embodiment, the silicide layer is formed by a process that includes depositing a metal layer, such as nickel, and annealing the metal layer such that the metal layer is able to react with target layer including silicon to form a silicide layer. The metal layer may be deposited using conventional processes such as physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), or atomic layer CVD (ALCVD). The annealing may use a rapid thermal anneal (RTA) in a gas atmosphere such as Ar, He, $N_2$, or other inert gas. A second annealing may be used to provide a stable silicide layer. The silicide materials may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The silicide layer may be fully silicided.

Figure 8:
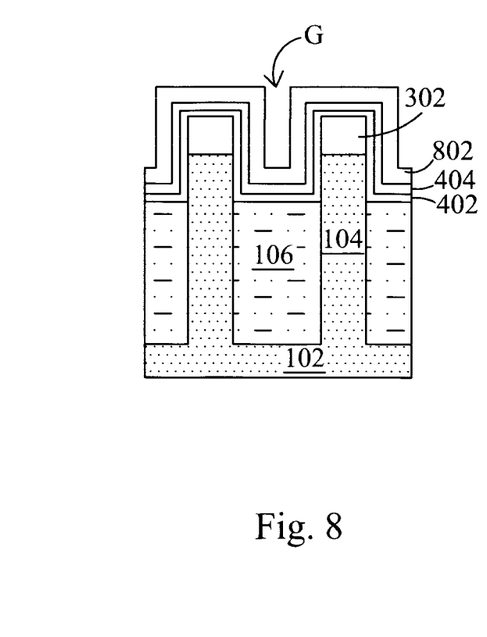
Figure 9:
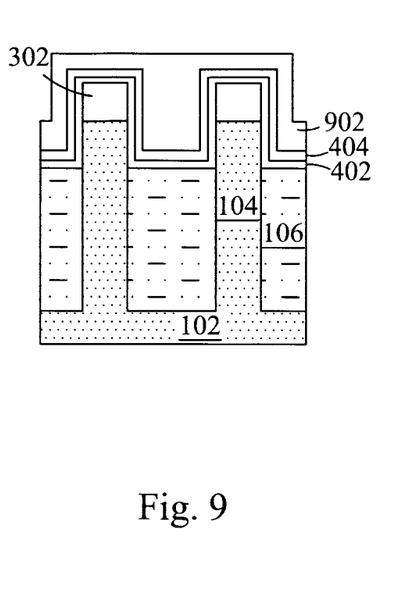

Referring to the example of FIG. 8, the layer 702 (of FIG. 7) has been fully silicided to form silicide layer 802. FIG. 8 illustrates an embodiment having a gap G between the fins 104. In another embodiment, FIG. 9 illustrates the layer 702 is fully silicided such that a silicide layer 902 is formed. The silicide layer 902 fills the region between the fins 104, leaving no gap. The embodiments of FIGS. 8 and 9 may be determined by the thickness of the layer 702 and/or silicidation conditions.

Figure 13:
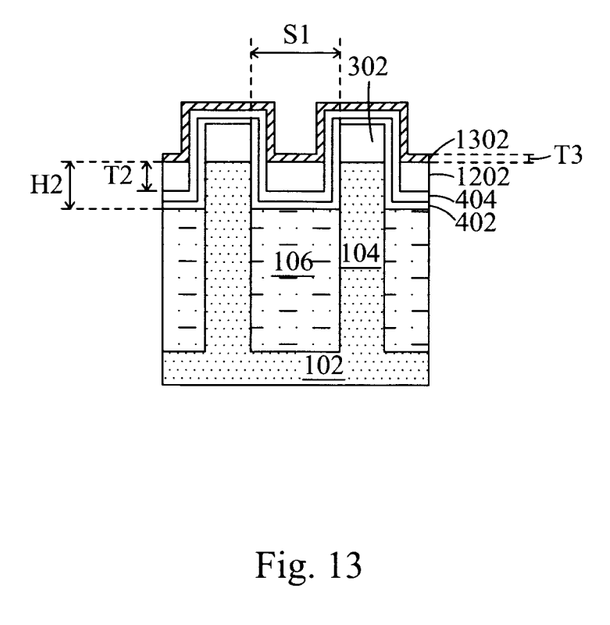
Figure 14:
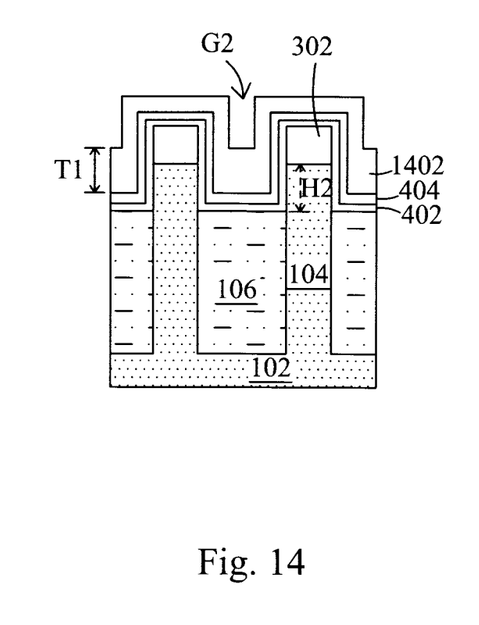

Referring to the example of FIG. 14, the layer 1302 (e.g., a-Si) and the etched polysilicon layer 1202 (of FIG. 12) have been (both) fully silicided to form silicide layer 1402. FIG. 14 illustrates an embodiment having a gap G2 between the fins 104. However, in other embodiments, the silicide layer 1402 may fill the region between the fins 104, thus leaving no gap. The silicide layer 1402 has a thickness T1. The thickness T1 may be greater than the fin height H2. The silicide layer 1402 top surface may lie above the top surface of the fin 104.

Figure 17:
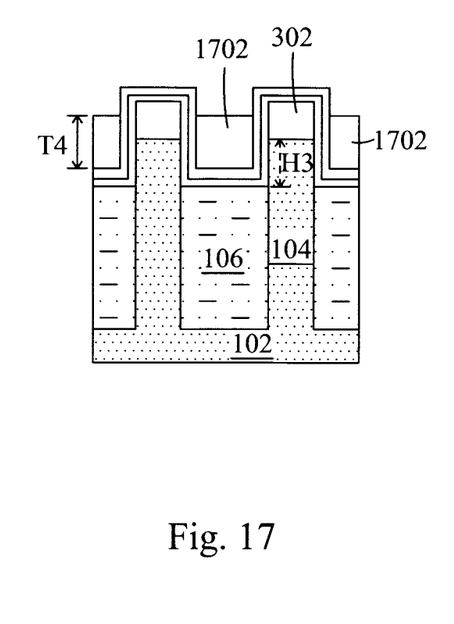
Figure 18:
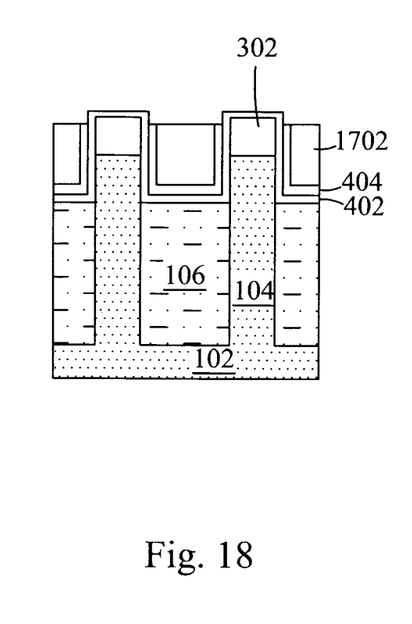

Referring to the example of FIG. 17, the etched polysilicon layer 1602 (of FIG. 16) has been fully silicided to form silicide layer 1702. The silicide layer 1702 has a thickness T4. The thickness T4 may be greater than the fin height H3. The silicide layer 1702 top surface may lie above the top surface of the fin 104. Thus, the silicide layer 1702 can protect the work function layer 404 disposed on the sidewalls of the fin 104 during subsequent processes.

After the silicide layer is formed as described in various embodiments above, any remaining non-reacted metal layer may be removed from the substrate. In an embodiment, the non-reacted nickel is removed from the substrate. In an embodiment, material overlying the hard mask formed on the fin may also be removed. Referring to the example of FIG. 18, the work function metal 404 has been removed from the top surface of the hard mask layer 302 (see FIG. 17).

The method 200 then proceeds to block 214 where a fill metal layer is formed on the substrate. The fill metal layer may be formed on the silicide layer formed as described above with reference to block 212. The fill metal layer may serve to "fill" the remaining portions of the gate structure such that a contact can be formed. In an embodiment, the fill metal fills in the remaining portion of the trenches or openings formed by the removal of the dummy gate structure in a replacement gate process. The fill metal layer may include Al, W, or Cu and/or other suitable materials. The fill metal may be formed by CVD, PVD, plating, and/or other suitable processes.

Figure 10:
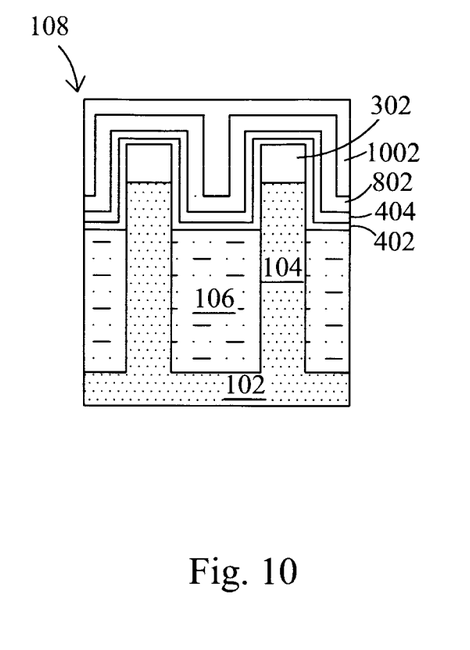
Figure 11:
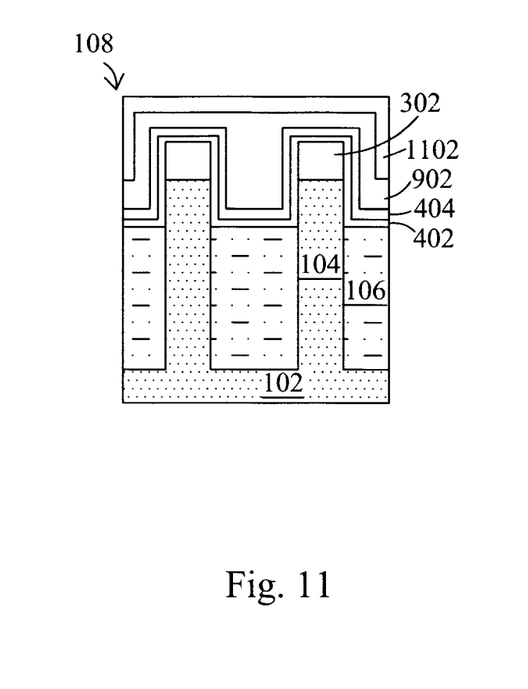

Referring to the example of FIG. 10, a fill metal layer 1002 is disposed on the silicide layer 802. FIG. 10 illustrates the embodiment of FIG. 8 after fill metal layer 1002 deposition. Referring to the example of FIG. 11, a fill metal layer 1102 is disposed on the silicide layer 902. FIG. 11 illustrates the embodiment of FIG. 9 after fill metal layer 1102 deposition.

Figure 15:
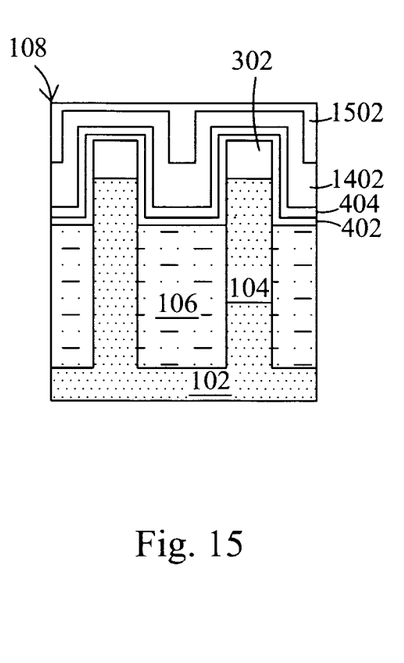
Figure 16:
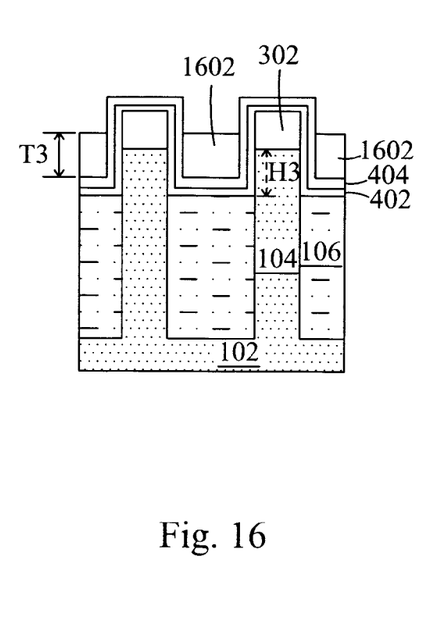
FIGS. 16-19 are cross-sectional views of a third embodiment of the semiconductor device of FIGS. 3-5 at subsequent stages of fabrication according the method of FIG. 2.

Referring to the example of FIG. 15, a fill metal layer 1502 is disposed on the silicide layer 1402. FIG. 15 illustrates the embodiment of FIG. 14 after fill metal layer 1502 deposition.

Figure 19:
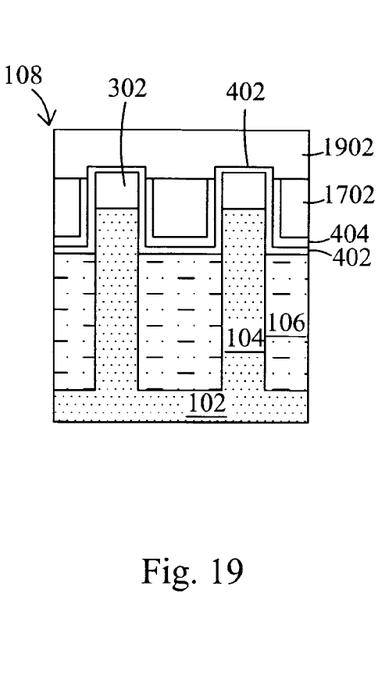

Referring to the example of FIG. 19, a fill metal layer 1902 is disposed on the silicide layer 1702. FIG. 19 illustrates the embodiment of FIGS. 18-19 after fill metal layer 1902 deposition.

The method 200 may continue to include further CMOS or MOS technology processing to form various features known in the art. Exemplary processes that may be performed include the formation of contact features coupled to the gate structure including fill metal layer, and a multi-layer interconnect (MU) having via and interconnect lines that may interconnect one or more semiconductor devices formed on the substrate.

Thus, it will be appreciated that provided are devices and methods of fabricating devices that provide for a silicide layer to be formed on the sidewalls of a fin. The fin may include the channel of a semiconductor device, such as a finFET. The silicide layer may benefit the device by providing a stress onto the fin, thereby inducing a strain in the channel region of the device. The finFET may be a dual-gate finFET device having a hard mask layer disposed on the top surface of the fin. It is understood that different embodiments disclosed herein offer different disclosure, and that they may make various changes, substitutions and alterations herein without departing from the spirit and scope of the present disclosure.

In one embodiment, a semiconductor device is described that includes a substrate having a fin with a top surface and a first and second lateral sidewall. A hard mask layer is formed on the top surface of the fin. A gate dielectric layer is formed on the first and second lateral sidewalls of the fin. A work function metal layer formed on the gate dielectric layer on the first and the second lateral sidewalls of the fin. A silicide layer is formed on the work function metal layer on the first and the second lateral sidewalls of the fin.

Also described is a method of semiconductor fabrication including providing a semiconductor substrate having a first fin and a second fin and forming a hard mask layer on a top surface of the first fin and the second fin. A work function metal layer is also formed on the first and second fin. Thereafter, at least one layer including silicon on the work function metal layer. A silicide process is performed on the at least one layer including silicon thus forming a silicide layer.

In yet another embodiment, a fin-type field effect transistor (finFET) device is provided. The device includes a first fin and a second fin and an isolation structure interposing the first and second fin. A first gate structure interfaces the sidewalls of the first fin. A second gate structure interfaces the sidewalls of the second fin. The first gate structure and the second gate structure each include a fully-silicided layer. The fully-silicided layer provides a stress to a channel region of the first fin and the second fin.

In a further embodiment, the finFET device may include a hard mask layer formed on a top surface of the first gate structure and the second gate structure. The finFET may be a dual-gate device (e.g., defining a channel by contacting two sides (e.g., lateral sidewalls) of the fin). The fully-silicided layer may interpose a work function layer and a fill metal layer in the gate structure.

What is claimed is:

1. A semiconductor device, comprising:
   a substrate including a first fin, wherein the first fin includes a top surface and a first and second lateral sidewall;
   a hard mask layer formed on the top surface of the first fin;
   a gate dielectric layer formed on the hard mask layer and the first and second lateral sidewalls of the first fin;
   a work function metal layer formed on the gate dielectric layer on the first and the second lateral sidewalls of the first fin;
   a silicide layer formed directly on the work function metal layer on the first and the second lateral sidewalls of the first fin, wherein the silicide layer is not formed on the top surface of the first fin; and
   a metal fill layer disposed on the silicide layer.

2. The semiconductor device of claim 1, further comprising: a second fin adjacent the first fin, wherein the metal fill layer interposes the first and second fins.

3. The semiconductor device of claim 1, further comprising a second fin, wherein the silicide layer has a thickness between the first and second fins that is greater than a height of the first fin, and wherein the height of the first fin is defined by a distance the first fin extends above an isolation structure disposed on the substrate, and wherein the silicide layer thickness is defined in a direction parallel the first and second lateral sidewalls of the first fin.

4. The semiconductor device of claim 1, further comprising a second fin, wherein the silicide layer has a thickness between the first and second fins that is less than a height of the first fin wherein the height of the first fin is defined by a distance the first fin extends above an isolation structure disposed on the substrate, and wherein the silicide layer thickness is defined in a direction parallel the first and second lateral sidewalls of the first fin.

5. The semiconductor device of claim 1, wherein the silicide layer includes nickel silicide (NiSi).

6. The semiconductor device of claim 1, wherein the silicide layer is not disposed on a top surface of the hard mask layer.

7. A method of semiconductor fabrication, comprising:
   providing a semiconductor substrate having a first fin and a second fin;
   forming a hard mask layer on a top surface of the first fin and the second fin;
   forming a work function metal layer on the first and second fin;
   forming at least one layer that includes silicon on the work function metal layer wherein the forming the at least one layer that includes silicon includes partially etching a polysilicon layer formed on the first fin and the second fin to form an etched polysilicon layer;
   performing a silicide process on the at least one layer that includes silicon including transforming the etched polysilicon layer to a silicide material to form a silicide layer; and
   forming a fill metal layer on the silicide layer.

8. The method of claim 7, wherein the silicide layer is formed directly on the work function metal layer.

9. The method of claim 7, wherein the forming the at least one layer that includes silicon further includes forming an amorphous silicon layer.

10. The method of claim 7, wherein the forming the at least one layer that includes silicon further includes forming an amorphous silicon layer on the polysilicon layer, wherein the performing the silicide process includes transforming the amorphous silicon layer and the polysilicon layer to a silicide layer.

11. The method of claim 7, wherein the etched polysilicon layer has a thickness of greater than approximately two-thirds a height of the first fin.

12. The method of claim 7, wherein the etched polysilicon layer has a thickness of greater than a height of the first fin.

13. The method of claim 7, further comprising:
   depositing the polysilicon layer; and
   patterning the polysilicon layer to form a gate structure, wherein the etching the polysilicon layer to form the etched polysilicon layer is performed after the patterning the polysilicon layer.

14. A method of fabricating a fin-type field effect transistor (finFET) device, comprising:
 providing a first fin and a second fin extending from a substrate, wherein an isolation structure interposes the first and second fin;
 forming a first gate structure interfacing the sidewalls of the first fin;
 forming a second gate structure interfacing the sidewalls of the second fin,
  wherein the forming the first gate structure and the second gate structure each include forming a fully-silicided layer of the first gate structure and the second gate structure, and wherein the fully-silicided layer provides a stress to a channel region of the first fin and the second fin, wherein the forming the fully-silicide layer includes:
  depositing a silicon layer on the substrate;
  partially etching the silicon layer to form a target layer; and
  performing a silicidation process on the target layer to form the fully-silicide layer.

15. The method of fabricating the finFET device of claim 14, further comprising:
 depositing a hard mask layer formed on a top surface of the first fin and the second fin.

16. The method of fabricating the finFET device of claim 14, wherein the finFET is a dual-gate device.

17. The method of fabricating the finFET device of claim 14, wherein the forming the first gate structure further comprises forming a fill metal layer of the first gate structure, wherein the fully-silicided layer interposes a work function layer and a fill metal layer of the first gate structure.

* * * * *